United States Patent [19]
Kim

[11] Patent Number: 5,830,787
[45] Date of Patent: Nov. 3, 1998

[54] METHOD FOR FABRICATING A THIN FILM TRANSISTOR

[75] Inventor: Hong Seuk Kim, Kyungki-do, Rep. of Korea

[73] Assignee: LG Semicon Co., Ltd., Chungcheongbuk-Do, Rep. of Korea

[21] Appl. No.: 747,718

[22] Filed: Nov. 12, 1996

Related U.S. Application Data

[63] Continuation-in-part of Ser. No. 409,546, Mar. 24, 1995, abandoned, which is a continuation of Ser. No. 209,059, Mar. 9, 1994, abandoned.

[30] Foreign Application Priority Data

Mar. 18, 1993 [KR] Rep. of Korea ..................... 1993/4169

[51] Int. Cl.⁶ .................................................. H01L 2/336
[52] U.S. Cl. ......................... 438/163; 438/305; 438/303; 438/231; 438/230; 438/286
[58] Field of Search .................... 438/163, 303, 438/305, 230, 231, 286, 40 TFT, 41 TFT, 21, 458, 492

[56] References Cited

U.S. PATENT DOCUMENTS

| | | | |
|---|---|---|---|
| 4,394,182 | 7/1983 | Maddox, III | 438/163 |
| 4,851,363 | 7/1989 | Troxell et al. | 437/40 |
| 5,100,820 | 3/1992 | Tsubone | 437/44 |
| 5,362,660 | 11/1994 | Kwasnick et al. | 437/40 |
| 5,427,971 | 6/1995 | Lee et al. | 438/303 |
| 5,498,556 | 3/1996 | Hong et al. | 438/305 |
| 5,573,965 | 11/1996 | Chen et al. | 438/305 |
| 5,637,514 | 6/1997 | Jeng et al. | 438/305 |
| 5,654,215 | 8/1997 | Gardner et al. | 438/305 |
| 5,656,518 | 8/1997 | Gardner et al. | 438/305 |

FOREIGN PATENT DOCUMENTS

| | | | |
|---|---|---|---|
| 56124272 | 9/1981 | Japan | 437/43 |
| 56-164569 A | 12/1981 | Japan | 437/981 |

OTHER PUBLICATIONS

Zhang et al., "The Effects of Nonuniform Oxide Thickness on MOSFET Performance", IEEE Transactions on Electron Devices, vol. 35, No. 8, Aug. 1988, pp. 1395–1397.

Crowder et al., "DMOS FET with Common Field and Channel Doping", IBM Technical Disclosure Bulletin, vol. 20, No. 4, Sep. 1977, pp. 1617–1621.

Paper Entitled "16MBIT SRAM Cell Technologies for 2.0V Operation" By H. Ohkubo, Et al., Presented at the International Electron Devices Meeting, Dec. 8–11, 1991.

Sze, "Semiconductor Devices: Physics and Technology", pp. 422–423, 1985.

Morgan, Russ A., "Plasma Etching in Semiconductor Fabrication", pp. 76–77, 1985.

Wolf et al., "Silicon Processing for the VLSI Era Vol. 1: Process Technology", pp. 529–534, Lattice 1986.

*Primary Examiner*—Mary Wilczewski
*Attorney, Agent, or Firm*—Morgan, Lewis & Bockius LLP

[57] ABSTRACT

A method for fabricating a thin film transistor (TFT), including the steps of forming a semiconductor layer on a substrate; forming an insulating oxide layer on the semiconductor layer; forming a polysilicon layer on the insulating layer; etching the polysilicon layer to form a gate electrode having tapered sides; carrying out an oxidation process on exposed surfaces of the gate electrode and the polysilicon layer surrounding the gate electrode resulting in the oxide layer thereby formed being thicker below the bottom edges of the tapered sides of the gate electrode than on other portions of the gate electrode and the surrounding polysilicon layer; and forming impurity regions in the semiconductor layer on opposite sides of the gate electrode to thereby form a transistor. The TFT thereby formed has a tapered gate and reduced OFF current.

21 Claims, 6 Drawing Sheets

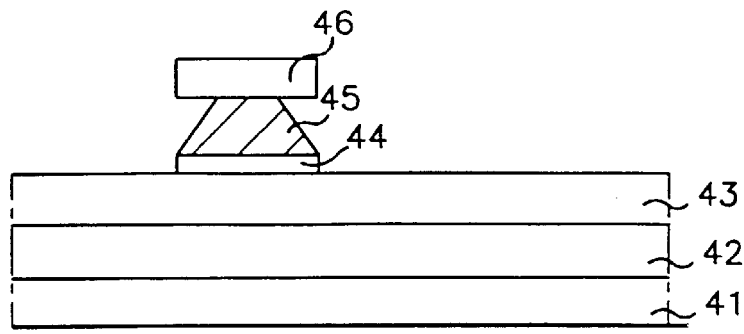
F I G.4a
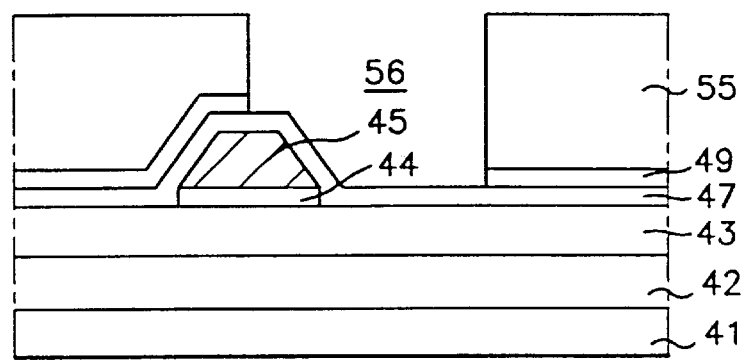
F I G.4b
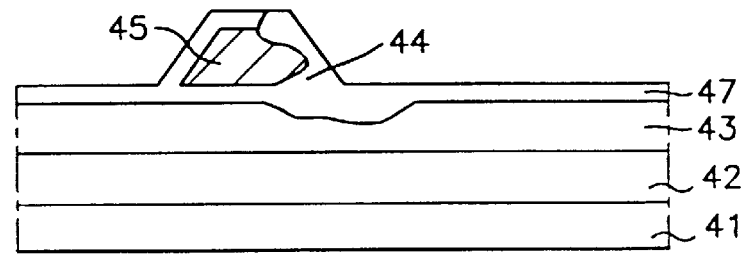
F I G.4c

METHOD FOR FABRICATING A THIN FILM TRANSISTOR

This application is a continuation-in-part of application Ser. No. 08/409,546, filed Mar. 24, 1995, now abandoned. This is a continuation of application Ser. No. 08/209,059 filed Mar. 9, 1994, now abandoned.

FIELD OF THE INVENTION

This invention relates to methods for fabricating a Thin Film Transistor (TFT), and more particularly to a Transistor having a tapered gate and enabling to reduce the off current and to be used as a higher integrated device (SRAM of at least 4 Mb) or in an LCD.

BACKGROUND OF THE INVENTION

A Thin Film Transistor (hereinafter referred to as a TFT) is used not only as a load resistor in a high density Static Random Access Memory (SRAM) with memory capacities of 4 Mb or more, but as a switching element for Liquid Crystal Displays (LCD).

It is preferable to use a TFT having a higher ratio of ON to OFF current because of a low OFF current and high ON current.

FIG. 1 is a sectional view showing a Top Gate type OFF-SET TFT (abbreviated as TGOS TFT hereinafter).

TGOS TFT of FIG. 1 has a gate 17, a drain area 15 spaced from the gate by a predetermined distance and a source area 14 which is overlapped with the gate, resulting in the extended length of a channel region 13.

Although such a structure provides the reduced OFF current compared to the general TFT having a non-overlapped configuration, the improvement of the on/off characteristics is not accomplished owing to the decreased ON current by the extended channel.

FIGS. 2A to 2D are sectional views explaining the steps of manufacturing TGOS TFT having an LDD (Lightly Doped Drain) which enables the ON current to be increased.

With reference to FIG. 2A, formed on a substrate 21 from an N type semiconductor material is a layer of silicon dioxide 22 on which a body polysilicon film 23 is deposited and followed by silicon ion implantation so as to improve the characteristics of the polysilicon film 23. Amorphous silicon (a-Si) may be used instead of the polysilicon layer 23.

The body polysilicon film 23 which is subjected to the implantation of silicon ions becomes a-Si. This is followed by an annealing at temperatures of 600 degrees C. ±50 degrees C. for five hours or longer, or alternatively laser annealing to form a polysilicon film.

And then ion implantation process is carried out to adjust the threshold voltage.

A polysilicon layer 25 for forming a gate is deposited over a gate oxide layer 24 of HTO (High Temperature Oxide) or HLO (High Temperature Low Pressure Oxide).

Subsequently, in order to form a gate pattern, the coated photoresist film on the polysilicon layer 25 is patterned by exposure and development to form a resist pattern 26 corresponding to the gate pattern to be formed.

As shown in FIG. 2A, the resist pattern 26 is used as a mask in etching away the revealed polysilicon layer 25 and oxide layer 24, to leave a gate oxide layer and a gate.

Upon removal of the photoresist pattern 26, another photoresist film 27 is coated on the entire surface of the substrate.

By photolithography, only on some portion of the gate 25 is disposed a resist pattern 27 which acts as a mask for forming p-drain area 28 partially overlapped with the gate 25 by the P implantation with light doping concentrations into the polysilicon layer 23 as shown in FIG. 2B.

After removing the photoresist pattern 27, another photoresist film 29 is coated on the whole surface of the substrate.

Referring to FIG. 2C, on the area from the center portion of the gate 25 to some surface portion of the P– drain region 28 a resist pattern 29 is disposed which acts as a mask. With the mask of the resist pattern 29 and exposed gate 25, the ion implantation process with high concentration P-type impurities into the polysilicon layer 23 is carried out to form P+ source area 30 overlapped with the gate 25 and P+ drain area 32 spaced from the gate 25 by a certain distance.

After removing the photoresist pattern 29, the body polysilicon layer 23 having the source and drain 30, 31 therein is patterned using the coated and patterned photoresist film 32 acting as a mask on the resultant structure so as to complete the fabrication of the TFT.

However, the above described manufacture of TGOS LDD TFT has the following problems. First, while the ON current is increased compared to TGOS TFT of FIG. 1, the OFF current is larger, so that the features of the device are deteriorated due to the reduced on/off current ratio. Second, the stepper equipment makes it difficult to embody the device with the fine line design rule according to the recent requirement of high density.

SUMMARY OF THE INVENTION

It is an object of this invention to provide a TFT having a gate in a tapered shape and a gate insulating layer having a relative thick portion on both lower sides of the gate so as to improve the characteristics of the device by an increased on/off current ratio, and being suitable for applying to LCD or SRAM with memory capacities of at least 4 Mb.

A TFT of this invention comprises a substrate; a semiconductor layer on the substrate; a gate electrode formed over the semiconductor layer and having an upper surface and a lower surface of a different size than the upper surface; and an impurity area formed in the semiconductor layer on both sides of the gate electrode.

Also, a method for fabricating a TFT of this invention comprises the steps of: forming a semiconductor layer on a substrate; forming a gate insulating layer and a polysilicon layer for a gate electrode; defining an area corresponding to a gate electrode pattern; forming a tapered gate electrode by isotopically etching the polysilicon layer; carrying out the oxidation process over a revealed gate electrode; forming a first impurity area in a semiconductor layer of one side of the gate electrode; and forming a second impurity area in the semiconductor layer except for the first impurity area and the gate electrode.

BRIEF DESCRIPTION OF THE DRAWINGS

FIGS. 4A to 4F are sectional views explaining the process steps of forming a TFT having a tapered gate according to the second embodiment of the present invention.

DETAILED DESCRIPTION OF THE INVENTION

More details of a preferred embodiment for accomplishing the objects of the present invention will be described below with reference to the accompanying drawings.

FIGS. 3A to 3E are sectional views illustrating the process steps for manufacturing TFT according to the present invention.

Figure 1:
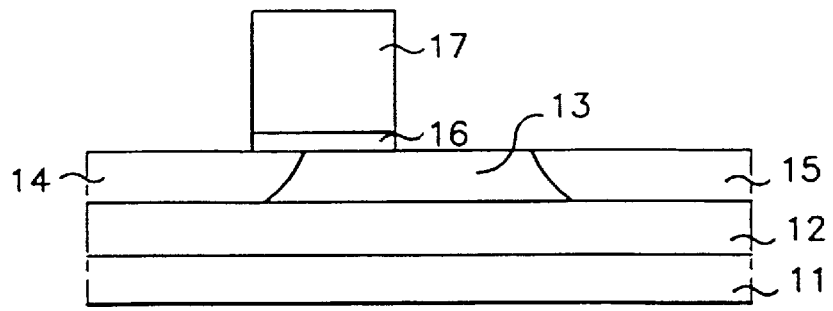
FIG. 1 is a sectional view showing the conventional TGOS TFT structure.
Figure 2A:
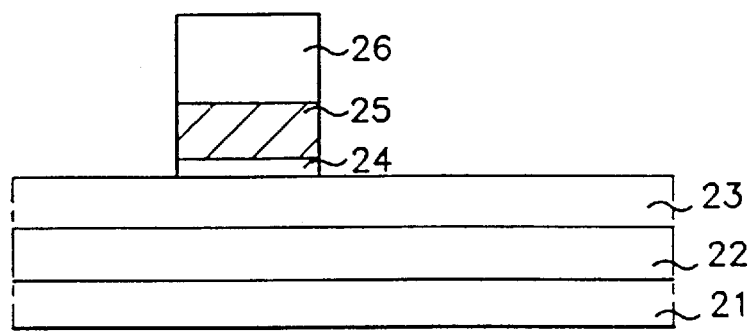
FIGS. 2A to 2D are sectional views explaining the process steps of TGOS TFT having LDD according to the conventional art.
Figure 2B:
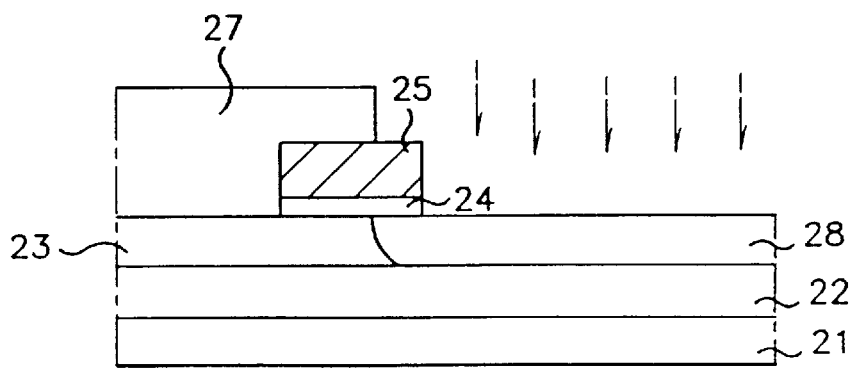
Figure 2C:
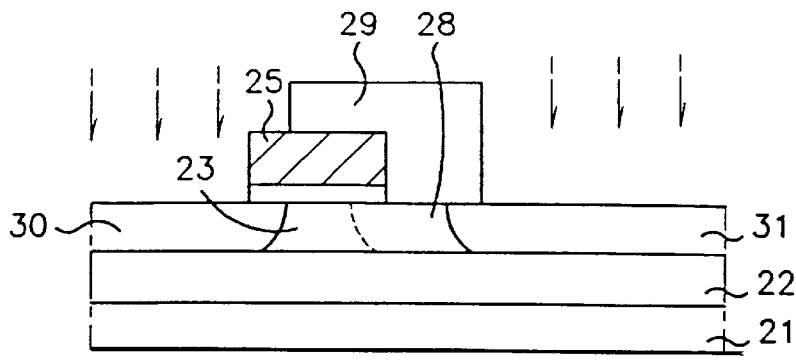
Figure 2D:
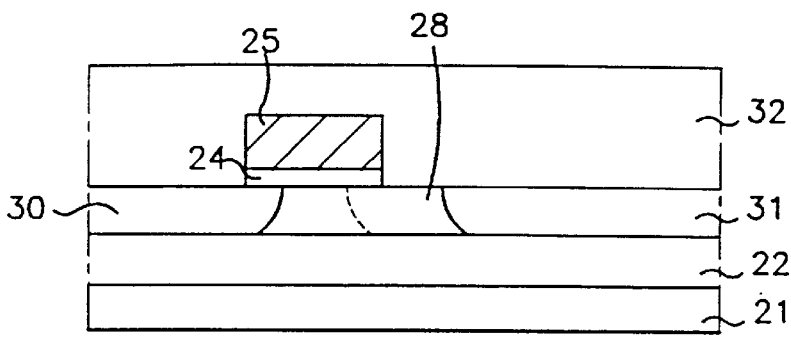
Figure 3A:
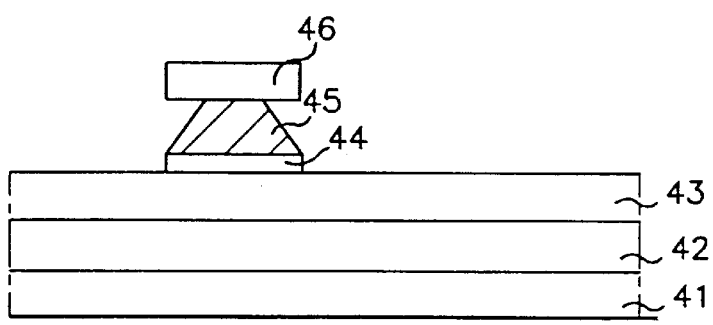
FIGS. 3A to 3E are sectional views explaining the process steps of forming a TFT having a tapered gate according to the present invention.

With reference to FIG. 3A, on a substrate 41 an N-type semiconductor material is formed a layer of silicon dioxide 42 on which a body polysilicon film 43 is deposited and then followed by an implantation of silicon ions for adjusting the threshold voltage into the polysilicon film 43.

The body polysilicon film 43 which is subjected to the implantation of silicon ions for improving the film 43 becomes an a-Si. This is followed by an annealing at temperatures of 600 degrees C. ±fifty degrees C. for five hours or longer, or alternatively laser annealing to form a polysilicon film.

Thereafter, a polysilicon layer 45 for forming a gate is deposited over a gate oxide layer 44 of HTO (High Temperature Oxide) or HLO (High Temperature Low Pressure Oxide).

A photoresist pattern 46 covering a gate area to be formed is formed by patterning the coated photoresist film on the entire surface of the polysilicon layer 45.

Using the resist pattern as a mask, as shown in FIG. 3A, a sloped etching is carried out to form a tapered gate 45 and simultaneously to remove the gate oxide layer 44 except for the resist pattern area.

Figure 3B:
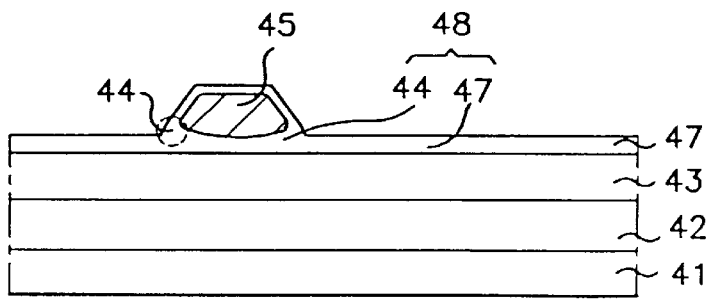

Referring to FIG. 3B, after removing the used resist pattern 46, the entire exposed surface of the substrate is oxidized, thereby forming a second oxide layer 47, wherein since the oxide grows many times faster on the oxide layer than on the undoped polysilicon layer 43, both lower end parts of the gate are oxidized quicker than other portions of the oxide layer 47, so that a thicker oxide layer 44 in both lower end parts of the gate is formed.

Figure 3C:
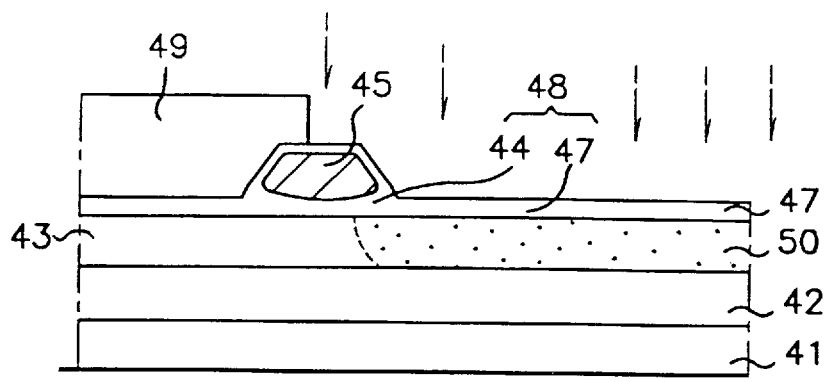

A photoresist pattern 49 is formed covering some top surface portion and sloped side surface of the gate. With the mask of the resist pattern 49 and gate 45, the P implantation with light concentrations is carried out to form P– drain 50 overlapped with the gate, as shown in FIG. 3C.

Figure 3D:
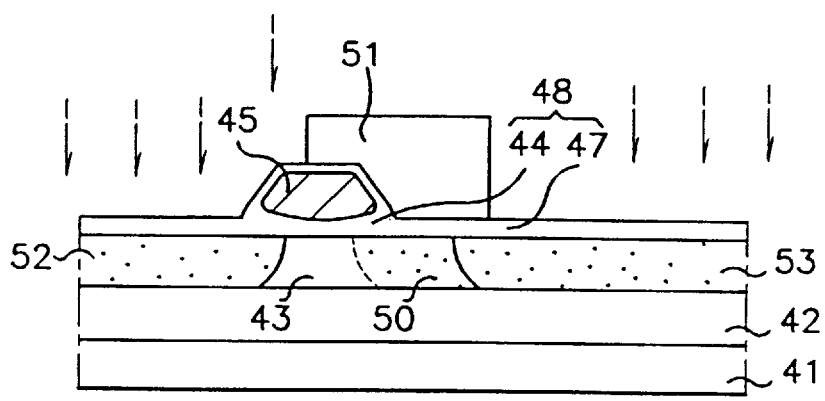

Referring to FIG. 3D, a resist pattern 51 is formed on the area from the center portion of the gate 45 to some surface portion of the P– drain region 50 which acts as a mask. With the mask of the resist pattern 51 and exposed gate 45, the ion implantation process with heavy concentration P type impurities into the polysilicon layer 43 is carried out to form P+ source area 52 overlapped with the gate 45 and P+ drain area 53 spaced apart from the gate 45 by a certain distance.

The used photoresist pattern 51 is continuously removed and another photoresist film 54 is coated, which film is patterned to cover the surface except for both sides of the gate oxide layer 48.

Figure 3E:
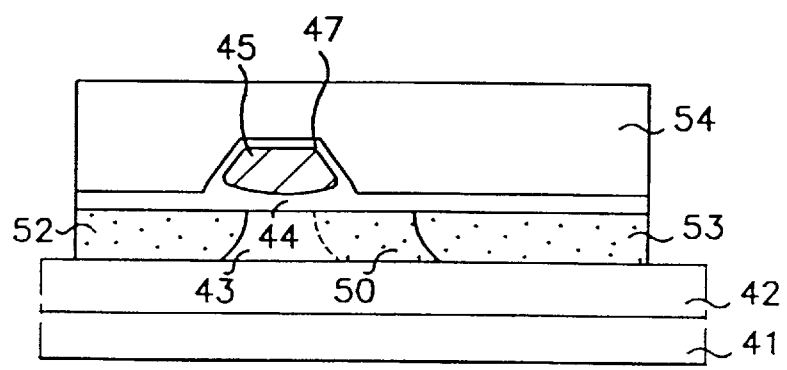

Referring to FIG. 3E, the revealed area of body polysilicon layer 43 and gate oxide layer 48 by the mask of the resist pattern 54 is etched away until the layer of silicon dioxide 42 is shown, wherein the body polysilicon layer comprises the source area 52 and the drain area 53. Therefore, a TFT according to the present invention is made.

FIGS. 4A through 4F are sectional views illustrating process steps for manufacturing a TFT according to a second embodiment of the present invention. First, referring to FIG. 4A, an oxide layer 42 acting as an insulating layer and a body polysilicon layer 43 are deposited on an n-type substrate 41 in this order, and an ion implantation process is carried out to adjust the threshold voltage. Subsequently, silicon ions are implanted into the polysilicon layer 43. The implantation involved in this process is to improve the characteristics of the body polysilicon 43. The polysilicon layer 43 becomes an amorphous silicon layer by the implanted silicon ions.

Thereafter, the amorphous silicon layer is annealed at a temperature range of 550° to 650° C. for more than five hours to transform from the amorphous to the polycrystalline structure. Alternatively, laser annealing method may be executed to form the polycrystalline silicon film. Then, a gate oxide layer 44, such as HTO (High Temperature Oxide) or LTO (Low Temperature Oxide), and a polysilicon layer for a gate 45 are deposited in this order. Subsequently, a photoresist film 46 is coated and then patterned by photolithography and etching process, thereby leaving the photoresist film 46 only at a region corresponding to the gate. The polysilicon layer 45 and the gate oxide layer 44 are slope-etched using the patterned photoresist film 46 as a mask by an isotropic etching method such as wet etching. The etching method forms a sloped gate 45 and also removes the gate oxide layer 44 such that only a region under the patterned photoresist film 46 remains.

Referring to FIG. 4B, the photoresist film 46 on the gate 45 is removed and an oxide layer 47 is coated with a thickness less than 1000Å on the entire surfaces of the gate 45 and the polysilicon layer 43. The oxide layer 47 can be formed with a thickness less than 1000Å by a thermal oxidation method. The oxide layer 47 acts as a buffer layer to reduce the stress generated during the oxidation process. Moreover, the oxide layer 47 can also be used as an etch stop layer in order to protect the gate 45 during patterning of a nitride layer 49. The nitride layer 49, such as $Si_3N_4$, is formed as an oxidation resist layer having a thickness less than 1000 Å on the oxide film 47. A photoresist film 55 is then coated on the nitride film 49. A mask for etching is aligned on the photoresist film 55 so that only a portion of the photoresist film 55 corresponding to an offset region 56 is exposed to the light source, for example. The portion of the photoresist film 55 and the nitride film 49 corresponding to the offset region 56 is removed by etching, as shown in FIG. 4B.

Referring to FIG. 4C, the photoresist film 55 is removed and the offset region 56 is then oxidized using the remaining nitride film 49 as a mask, thereby forming an offset gate oxide film 44. Then, the remaining nitride film is removed.

Figure 4D:
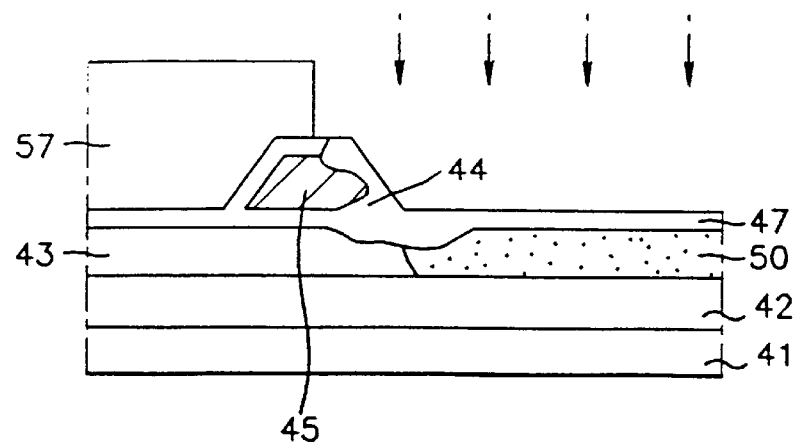

Referring to FIG. 4D, a photoresist film 57 is coated and then patterned by photolithography and etching process, thereby leaving the photoresist film 57 at only one side of the gate 45 (the side not including the offset gate oxide layer 44). P-type impurity ions with a low concentration are implanted into the body polysilicon layer 43 using the remaining photoresist film 57, the gate 45, and the offset gate oxide layer 44 as masks, thereby forming a p-type drain 50 overlapped in part with the gate 45.

Figure 4E:
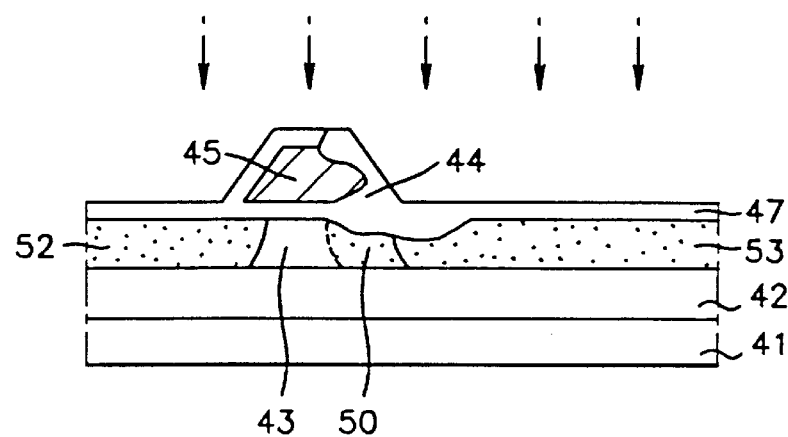

Thereafter, the remaining photoresist film 57 is removed and p-type impurity ions having a high concentration are implanted into the polysilicon layer 43 using the gate oxide layer 44 to form a $p^+$ type source region 52 and a $p^+$ type drain region 53, as illustrated in FIG. 4E. At this time, the source region 52 is formed overlapping in part with the gate 45 while the drain region 53 is formed that does not overlap with the gate 45. Here, the gate oxide 44 is thick enough to form an offset region 50, as shown in FIG. 4E.

Figure 4F:
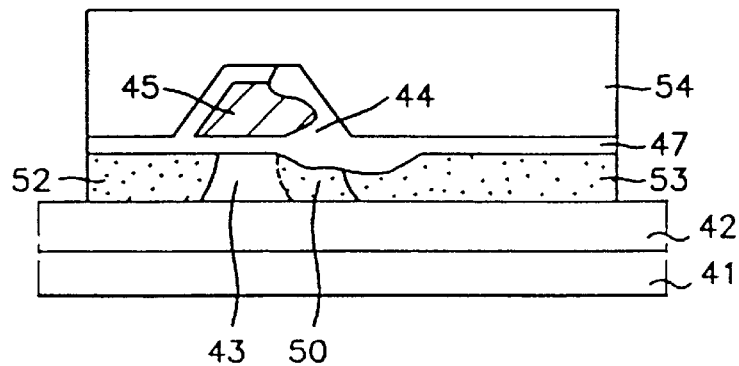

Referring to FIG. 4F, the polysilicon layer 43 having the source region 52 and the drain region 53 may be patterned together with the gate oxide layer 44, as desired, using a photoresist film 54 as a mask.

Alternatively, the present invention may be realized without the step of forming the photoresist film 57. In this instance, the p-type impurity ions are implanted into the polysilicon layer 43 using the gate 45 and the offset gate oxide layer 44 as masks. Thus, the step shown in FIG. 4D is skipped in this alternative process.

According to the second embodiment of the present invention, an additional offset mask is not required to define the source and drain regions upon the above ion implantation process. Moreover, the present invention has an advantage of suppressing leakage current caused by hot carriers.

Figure 5:
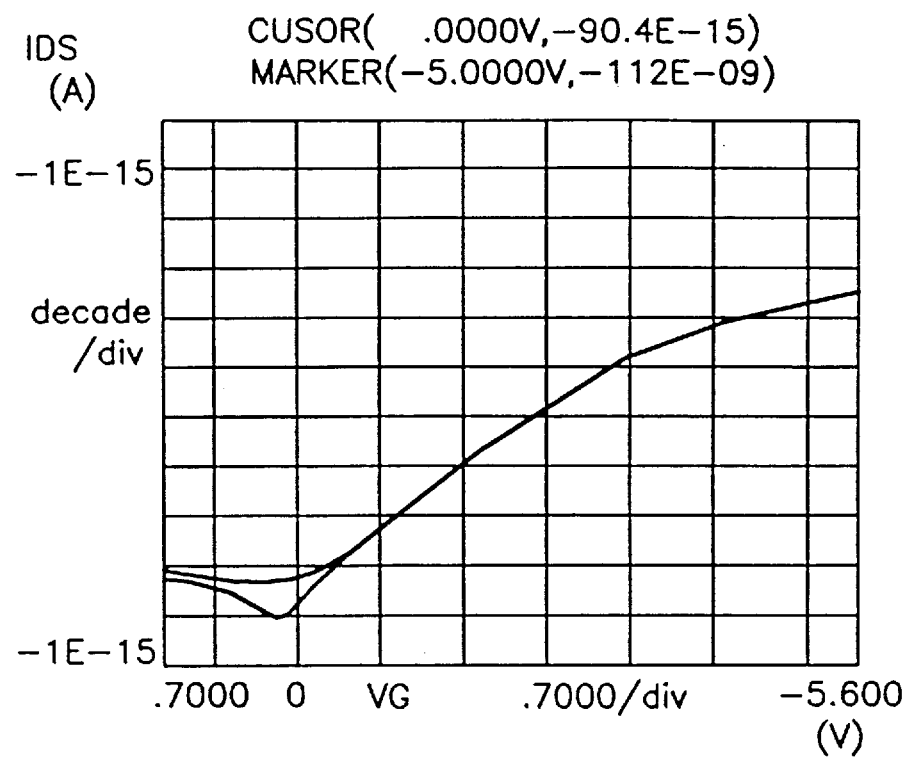
FIG. 5 is a graph showing the respective current characteristics of this invention and the conventional TFT.

FIG. 5 is a graph illustrating the current characteristics of TFT, compared with the conventional TFT.

The TFT in a preferred embodiment has a width/line of 0.6 micrometer/1.2 micrometer, the lightly doped drain area formed by BF2+ ion implant at a dosage level of 5E12 ions/cm$^2$ and an energy level of twenty-five keV, and the heavily doped source/drain area formed by BF2+ ion implant at a dosage level of 3E14 ions/cm$^2$ and an energy level of twenty-five keV.

Referring to FIG. 4, we can find out that while the conventional TFT has the OFF current of 5 fA, ON current of 103 nA and therefore the ratio of on/off current of 2E5, TFT according to this invention has the OFF current of 89 fA, ON current 102 nA and therefore the ratio of on/off current of 1.1E6.

Accordingly, the device of the invention has the ratio on/off current above five times than that of the conventional device. As the average value on seventy-five point, the ON, OFF current of the conventional TFT is respectively 101 nA and 518 fA, therefore the ratio of on/off current becomes 1.9E5, whereas the ON and OFF current according to this invention is 99 nA and 97 fA, therefore the ratio of on/off current becomes 1.1E6. Accordingly, we know that the above values approximate the measured values.

The device and manufacture thereof which is described as above exhibits the following advantages.

Since the gate oxide layer on both lower end parts of the gate is thicker than that of the other portion of the gate oxide layer, the drain area which is formed being implanted with light concentration has graded impurity concentration profile.

The leakage current is reduced due to the high potential difference between the gate and the drain area, so that the OFF current can be reduced to a greater extent that in the conventional TGOS TFT.

Also, the on current is increased as much as the ON current of conventional TGOS LDD TFT, so that the increased on/off current ratio results in the improvement of the device characteristics.

Further, the formed gate oxide layer by an oxidation of polysilicon for forming the gate enables to reduce the line width of gate and overcome the limitation of the semiconductor equipment capabilities.

What is claimed is:

1. A method for fabricating a thin film transistor, the method comprising the steps of:

forming a gate insulating layer on a substrate;

forming a gate electrode having at least one tapered side on the gate insulating layer;

forming a mask layer over the substrate and the gate electrode;

defining an offset region below the at least one tapered side of the gate electrode corresponding to the mask layer;

oxidizing a portion of the gate electrode and a portion of the substrate corresponding to the offset region; and forming first and second impurity regions in the substrate at sides of the gate electrode, the second impurity region being adjacent to the offset region.

2. The method according to claim 1, further comprising the step of forming an insulating layer on the gate electrode and the substrate.

3. The method according to claim 2, wherein the insulating layer on the gate electrode and the substrate has an etch selectivity different from an etch selectivity of the mask layer.

4. The method according to claim 1, wherein the step of forming the mask layer includes the step of forming a non-oxidizing layer.

5. The method according to claim 4, wherein the non-oxidizable layer includes a nitride layer.

6. The method according to claim 1, wherein the substrate includes a polysilicon layer.

7. The method according to claim 1, wherein the second impurity region is formed to not overlap the gate electrode.

8. A method for fabricating a thin film transistor, the method comprising the steps of:

providing a substrate;

forming a gate insulating layer over a portion of the substrate;

forming a gate electrode having at least one tapered side over the gate insulating layer;

forming an oxide film over the gate electrode and the substrate;

forming an insulating film over a portion of the oxide film:

oxidizing the oxide film to form a thicker portion using the insulating film as a mask, the thicker portion being at a region below the at least one tapered side of the gate electrode, implanting impurity ions into the substrate using the gate electrode as a mask to form first and second impurity regions, the second impurity region including an offset region corresponding to the thicker portion of the oxide film.

9. The method according to claim 8, wherein the step of forming the oxide film having the thicker portion includes the step of oxidizing the oxide film at a region below the at least one tapered side of the gate electrode using a mask.

10. The method according to claim 8, wherein the step of providing the substrate includes the steps of:

forming a first semiconductor layer;

forming an insulating layer on the first semiconductor layer; and forming a second semiconductor layer on the insulating layer.

11. The method according to claim 10, wherein the steps of forming the first semiconductor layer includes the step of forming a polysilicon layer.

12. The method according to claim 10, wherein the step of forming the second semiconductor layer includes the steps of forming a polysilicon layer.

13. The method according to claim 8, wherein the step of providing the substrate include the step of forming a polysilicon layer.

14. The method according to claim 8, wherein the second impurity region is formed to not overlap the gate electrode.

15. A method for fabricating a thin film transistor, the method comprising the steps of:

forming a first insulating layer on a substrate;

forming a first semiconductor layer on the first insulating layer;

forming a second insulating layer on the first semiconductor layer;

forming a second semiconductor layer on the second insulating layer;

forming a mask on the second semiconductor layer;

etching the second semiconductor layer to form a gate with at least one tapered side by removing a larger amount of the second semiconductor layer at a top portion of the gate adjacent to the mask and removing a smaller amount of the second semiconductor layer at a bottom portion of the gate;

forming a third insulating layer over the gate and the second semiconductor layer;

forming a fourth insulating layer having a pattern defining an offset region, the fourth insulating layer having an etch selectivity different from an etch selectivity of the third insulating layer;

oxidizing a portion of the gate electrode and a portion of the substrate corresponding to the offset region to form an oxide portion thicker than the second insulating layer;

forming a first impurity region in the second semiconductor layer corresponding to the offset region; and forming second and third impurity regions in the second semiconductor layer adjacent sides of the gate, one of the second and third impurity regions being connected to the first impurity region.

16. The method according to claim 15, wherein the one of the second and third impurity regions connected to the first impurity region is formed to not overlap the gate.

17. A method for fabricating a thin film transistor, comprising the steps of:

forming a gate insulating layer on a substrate;

forming a gate electrode on the gate insulating layer;

forming a first insulating film over an offset region and the gate electrode, the offset region being formed between one side portion of the gate electrode and an impurity region forming a patterned insulating film over the first insulating film;

oxidizing the first insulating film using the patterned insulating film as a mask; and forming the impurity region in the substrate at sides of the gate electrode.

18. The method according to claim 17, wherein the patterned insulating film has an etch selectivity different from the first insulating film.

19. The method according to claim 17, wherein the patterned insulating film corresponds to the offset region.

20. The method according to claim 17, wherein the patterned insulating film includes a nitride layer.

21. The method according to claim 17, wherein the impurity region is formed to not overlap the gate electrode.

* * * * *